United States Patent [19]

Kusakabe

[11] Patent Number: 4,590,433
[45] Date of Patent: May 20, 1986

[54] DOUBLED BALANCED DIFFERENTIAL AMPLIFIER CIRCUIT WITH LOW POWER CONSUMPTION FOR FM MODULATION OR DEMODULATION

[75] Inventor: Hiromi Kusakabe, Yokohama, Japan
[73] Assignee: Kabushiki Kaisha Toshiba, Kawasaki, Japan
[21] Appl. No.: 596,024
[22] Filed: Apr. 2, 1984
[30] Foreign Application Priority Data
Mar. 31, 1983 [JP] Japan ............................. 58-56089
[51] Int. Cl.$^4$ .................. H03D 1/18; H03D 3/00; H03K 3/281; H03K 17/60
[52] U.S. Cl. .......................... 329/50; 329/101; 329/122; 331/113 A; 332/16 T; 332/31 T; 307/244; 307/254
[58] Field of Search ............ 329/50, 101, 103, 122; 331/113 A; 332/16 T, 31 T; 307/244, 254

[56] References Cited

U.S. PATENT DOCUMENTS

| | | | |
|---|---|---|---|
| 3,962,551 | 6/1976 | Gay | 328/157 X |
| 4,184,128 | 1/1980 | Nilssen | 331/113 A |
| 4,300,019 | 11/1981 | Toyomaki | 329/146 X |
| 4,430,628 | 2/1984 | Nilssen | 331/113 A |

FOREIGN PATENT DOCUMENTS

| | | |
|---|---|---|
| 77091 | 4/1983 | European Pat. Off. |
| 56-47140 | 4/1981 | Japan |
| 1332513 | 10/1973 | United Kingdom |
| 1494570 | 12/1977 | United Kingdom |
| 2020519 | 2/1979 | United Kingdom |
| 2052218 | 1/1980 | United Kingdom |
| 1560069 | 1/1980 | United Kingdom |

OTHER PUBLICATIONS

Japanese Magazine, "Rajio Gijyutsu (Radio Technology)", vol. 12, 1971, pp. 226-271.

Primary Examiner—Eugene R. LaRoche
Assistant Examiner—D. C. Mis
Attorney, Agent, or Firm—Finnegan, Henderson, Farabow, Garrett & Dunner

[57] ABSTRACT

A switching circuit apparatus driven by a relatively low DC power supply voltage, which includes a power supply terminal designed to receive a DC power source voltage, a pair of switching circuits comprising switching transistors (28, 30 and 32, 34) connected in parallel with each other and connected to the power supply terminal, first circuit means (10,12) connected for supplying the respective switching circuits with a switched signal, and a second circuit means (16, 18, 40, 14) connected for supplying the respective switching circuits with a pair of control signals which are opposite in phase and which are never both at a potential difference other than a prescribed potential at the same time. The switching circuit transistors (28, 30 or 32, 34) are all fully conductive prior to any transition in which two are rendered non-conductive by the control signals, thereby enable operation of the circuit with low power consumption.

4 Claims, 7 Drawing Figures

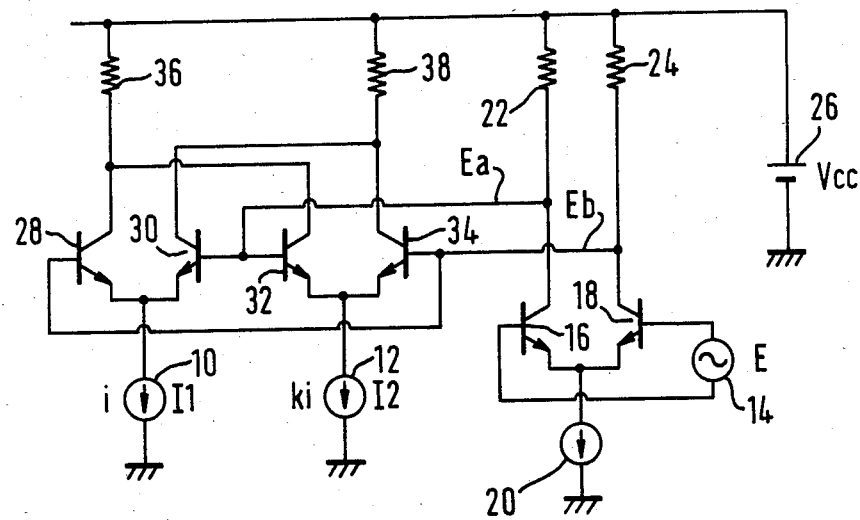
FIG.1 PRIOR ART
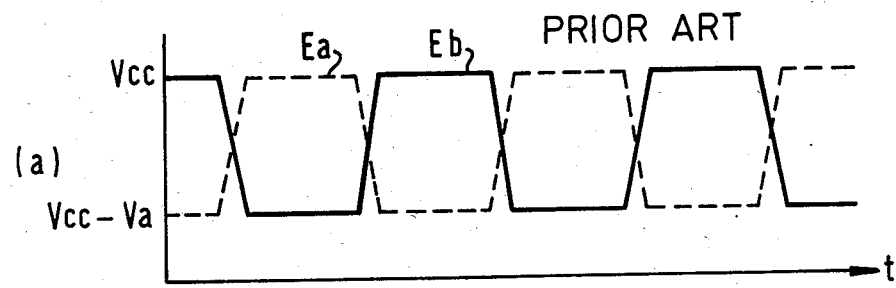
FIG.2
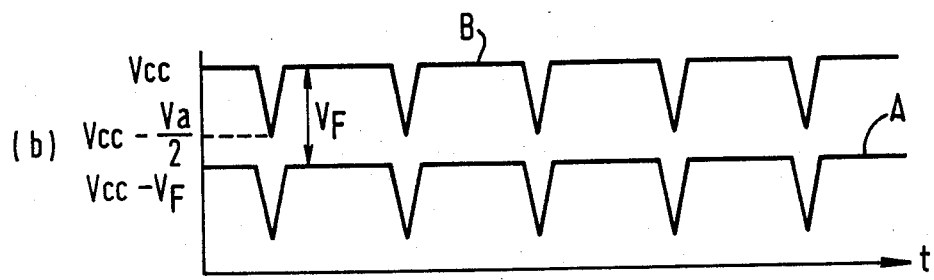

DOUBLED BALANCED DIFFERENTIAL AMPLIFIER CIRCUIT WITH LOW POWER CONSUMPTION FOR FM MODULATION OR DEMODULATION

BACKGROUND OF THE INVENTION

1. Field the Invention

This invention relates to a switching circuit apparatus, and more particularly to a switching circuit apparatus which may be adapted to a modulator, demodulator and the like.

2. Description of the Prior Art

Switching circuit apparatus adapted for modulators or demodulators are conventionally constructed by using a pair of switching circuits connected in parallel with each other to a DC power source. Each switching circuit is connected for receiving an input electrical signal to be switched, i.e., a switched signal, and another electrical signal with a given frequency for switching, i.e., a switching signal. The switching signal is applied to respective switching circuits in antiphase for alternately setting the switching circuits in an operative or inoperative condition so that the switched signal applied to respective switching circuits in the same phase is divided between output circuits of the switching circuits alternately in synchronism to the given frequency of the switching signal.

Thus switching circuit apparatus used for modulators modulates the switched signal with the switching signal of a given frequency. On the other hand, switching circuit apparatus used for demodulators demodulates a resultant signal modulated in the switched signal by a given frequency of the switching signal from the switched signal.

In prior art switching circuit apparatus, the pair of switching circuits are supplied a switching signal having square waveform at a 50% duty ratio. Although ideally the waveforms are square waves, they are in practice rounded at their transition edge portions due to influences of signal delay and stray capacitance in the transistor circuits. The pair of switching circuits connected in parallel with each other to the power supply source are both simultaneously put in operative conditions at transition edge portions of the waveforms, i.e., switching transition period of the switching circuit apparatus. The prior art switching circuit apparatus have drawbacks because the switched signal leaks to an undesired one of the switching circuits. Consequently, the prior art switching circuit apparatus fail to divide the switched signal into respective output circuits of the pair of switching circuits. Further, biasing currents from the power source flow through the switching circuits simultaneously at the switching transition period so that power source voltage is sufficiently lowered that the switching circuits will not operate properly. Thus prior art switching circuit apparatus require power sources supplying relatively high voltage.

An example of a prior art switching circuit apparatus is shown in FIG. 1 and is more fully discussed using FIG. 2 below in the Description of the Preferred Embodiment.

SUMMARY OF THE INVENTION

An object of this invention is the provision of switching circuit apparatus with minimal signal leakage.

Another object of the present invention is provision of switching circuit apparatus capable of operating at relatively low power supply voltage with low power consumption.

These and other objects are achieved in a switching apparatus of the subject invention which includes first and second power source terminals; first and second switching signal generators; first and second loads; switch means for selectively coupling the first and second generators and the first and second loads between the power source terminals in response to first and second control signals, the switching means including a first pair of transistors having current paths connected to selectively couple the first and second loads in series with the first and second signal generators, respectively, in response to the first control signal, and the switching means including a second pair of transistors having current paths connected to selectively couple the first and second loads in series with the second and first signal generators, respectively, in response to the second control signal; and means for generating the first and second control signals, with the first and second control signals rendering at least the current paths of one of the first and second pairs of transistors fully conductive prior to termination of conductivity of the current paths of either the first or second pair of transistors.

Additional objects, advantages, and features of the present invention will further become apparent to persons skilled in the art from a study of the following description and of the accompanying drawings.

BRIEF DESCRIPTION OF THE DRAWINGS

FIG. 1 is a circuit diagram of a prior art switching circuit apparatus;

FIG. 2 is a waveform diagram illustrative of operation of the prior art switching circuit apparatus shown in FIG. 1;

DESCRIPTION OF THE PREFERRED EMBODIMENTS

Figure 3:
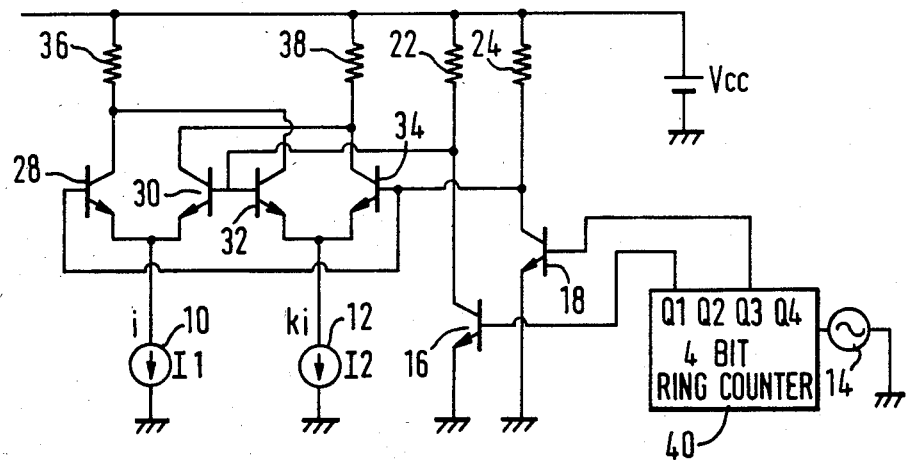
FIG. 3 is a circuit diagram of a switching circuit apparatus according to an embodiment of the present invention.

The present invention will now be described in detail with reference to the accompanying drawings. Throughout the drawings like reference numerals and letters are used to designate like or equivalent elements for the sake of simplicity of explanation.

Referring now to FIG. 1, there is shown a prior art double balanced type switching circuit apparatus as a low-voltage version of a multiplex decoder. The multiplex decoder is a GE-Zenith system for receiving FM stereo broadcasts. Current sources 10, 12 employed in double balanced differential amplifier circuit, which will be described later, contain DC components $I_1$, $I_2$ and AC components as switched signals i, ki. A proportional constant k is added in current source 12 applied to the switched signal i dependent on an input composite signal from a matrix circuit (not shown). This proportional constant k is a coefficient introduced to gain an effective separation of right audio and left audio signals from the composite signal according to the GE-Zenith system. More details are described in the literature, in a Japanese magazine entitled "*Rajio Gijyutsu (Radio Technology)*", December, 1971, pages 269 and 270.

A signal source 14 generates a reproduced subcarrier signal E having a frequency of 38 kHz. Subcarrier signal E is supplied as a switching signal to the bases of a differential pair of transistors 16 and 18 which have emitters connected in common to a current source 20. The collectors of the transistors 16 and 18 to which load resistors 22 and 24 for switching signals $E_a$, $E_b$ are connected, produce output waveforms as shown in FIG. 2(a). Switching signal $E_b$ shown with the solid-line waveform is produced by transistor 18 while switching signal $E_a$ shown with the broken-line waveform is produced by transistor 16. Even if subcarrier signal E has an ideal square waveform, output waveforms of switching signals $E_a$, $E_b$ are normally deformed to trapezoidal waveforms due to influences of a signal delay and a stray capacitance in the transistors. Switching signals $E_a$, $E_b$ have peak values equal to a voltage $V_{cc}$ of a power supply source 26.

Two differential pairs of transistors 28, 30 and 32, 34 are of a double balanced differential amplifier circuit arrangement. Transistors 28 and 32 have collectors connected in common to an output load resistor 36, and transistors 30 and 34 have collectors connected in common to an output load resistor 38. Transistors 28 and 34 have commonly connected bases supplied with switching signal $E_b$ of trapezoidal waveform produced from the transistor 18, and transistors 30 and 32 have commonly connected bases supplied with switching signal $E_a$ of the trapezoidal waveform produced from transistor 16.

As seen from FIG. 2(a), transitions of the waveforms $E_a$ and $E_b$ respectively from peak to bottom or bottom to peak and vice versa occur at the same time. Therefore, transistors 28, 30 or 32, 34 in respective differential amplifiers are simultaneously put into their operational states at every transition period of switching signals $E_a$ and $E_b$. The potentials on the commonly connected emitters of the transistors 28, 30 and 32, 34 are then forced to drop for the transition periods. Potentials on common connected emitters of respective differential amplifiers then have a waveform A having wedge-shaped voltage drops as shown in FIG. 2(b).

Due to the above phenomenon, biasing voltages applied to current sources 10 and 12 are degraded from instantaneous wedgeshaped drops of waveform A. Accordingly, as voltage $V_{cc}$ of the power supply source 26 is reduced, biasing voltages normally required to enable current sources 10 and 12, composed of transistors, to operate becomes lowered and current sources 10 and 12 will not operate properly.

The conventional double balanced type switching circuit apparatus illustrated in FIG. 1, therefore, is subjected to certain limitations though it is designed for low-voltage operation.

A waveform B, shown in FIG. 2(b), is a combination of higher portions of the two waveforms shown in FIG. 2(a). Waveform A has a peak value which is lower than peak value of waveform B by a value $V_F$, a forward base-to-emitter voltage of the transistors.

Figure 4:
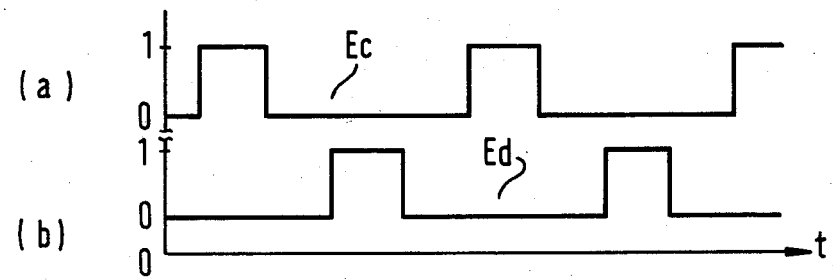
FIGS. 4 and 5 are waveform diagrams illustrating operation of the switching circuit apparatus of the invention.

Referring now to FIG. 3, there is shown a circuit diagram of one embodiment of a double balanced type switching circuit apparatus as a low-voltage version of a multiplex decoder constructed according to the present invention. The multiplex decoder can be used for a so-called GE-Zenith system for receiving FM stereo broadcasts. In FIG. 3, two differential pairs of transistors 28, 30, and 32, 34 of a double balanced circuit arrangement have current sources 10 and 12 and output load resistors 36 and 38. The transistors 28 and 34 have bases connected in common to a transistor 18 for relaying a first switching signal as described later, and the transistors 30 and 32 have bases connected in common to a transistor 16 for relaying a second switching signal as described later. A clock signal generator 14 generates a clock signal with a frequency of 76 KHz, which is two times the reproduced subcarrier signal with the frequency of 38 KHz. The clock signal generated from clock signal generator 14 is applied to a 4-bit ring counter 40 connected as a Johnson counter, which is well known in the art. The 4-bit ring counter 40 produces two asymmetric pulses $E_c$ and $E_d$ of 33⅓% duty cycle which are 180° out of phase from its outputs $Q_1$, $Q_3$ by dividing the frequency, i.e., 76 KHz of the clock signal. Pulses $E_c$ and $E_d$ have the same frequency of 38 KHz but are 180° out of phase from each other so that there will be periods in which both signals have a "0" level as shown in FIG. 4 at (a) and (b). The pulses $E_c$, $E_d$ are applied to bases of transistors 16 and 18 which are respectively connected to power supply source 26 through their collector loads 22 and 24. Collectors of transistors 16 and 18 are connected to commonly connected bases of transistors 30, 32 and 28, 34, respectively.

In operation, when pulses $E_c$ and $E_d$ from outputs $Q_1$ and $Q_3$ of the 4-bit ring counter 40 are in a "1" level, the corresponding transistor 16 or 18 is turned on to produce a voltage drop across the collector load 22 or 24. Then the collectors of transistors 16 and 18 supply the commonly connected bases of transistors 30, 32 or 28, 34 with switching signals $E_c$ and $E_d$. When the pulses $E_c$ and $E_d$ from outputs $Q_1$ and $Q_3$ are at a "0" level at the same time, both transistors 16 and 18 are rendered nonconductive with their collector potentials being substantially equal to voltage $V_{cc}$ of power supply source 26.

It will be understood from the illustrated waveforms $E_c$ and $E_d$ that by providing periods in which both transistors 16 and 18 remain turned off simultaneously, the voltage applied to the collector of either one of the transistors 16 and 18 is substantially equal to the voltage $V_{cc}$ of power supply source 26 at any point in time during operation.

Figure 5:
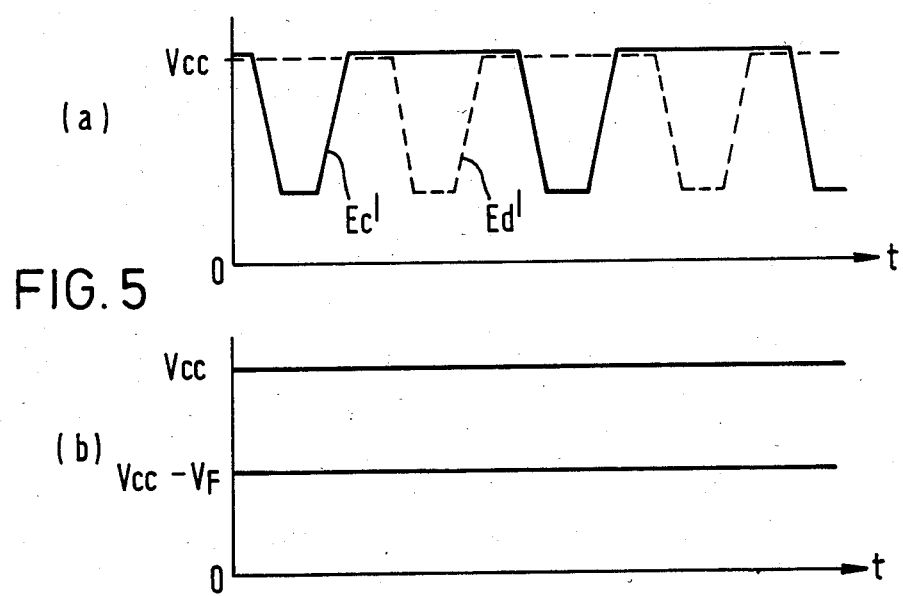

FIG. 5(a) shows waveforms of switching signals $E_c'$ and $E_d'$ appearing on collectors of the transistors 16 and 18 (the solid-line waveform is for the switching signal $E_c'$ from the transistor 16, while the broken-line waveform for the switching signal $E_d'$ from the transistor 18).

The transistors 30 and 32 in the respective differential pairs interconnected with each other in double balanced circuit arrangement are switched on and off by the switching signal $E_c'$, while the transistors 28 and 34 in respective differential pairs are turned on or off by switching signal $E_d'$. Both of the transistors 28, 30 or 32, 34 in the same differential pair, are then prevented from going active simultaneously. The voltage combined waveform at commonly connected emitters of transistors 28, 30 and 32, 34 in the same differential pair will never drop below a potential of $V_{cc}-V_F$ obtained by subtracting a forward base-to-emitter voltage $V_F$ of transistors from voltage $V_{cc}$ of power supply source 26 as shown in FIG. 5(b).

Since there are no momentary wedge-shaped voltage drops in the voltage waveform, the biasing voltage required for current sources 10 and 12 will not become inadequate even when voltage $V_{cc}$ is lowered to some slight extent. Consequently, the double balanced type switching circuit apparatus can operate at a low power supply source voltage.

Figure 6:
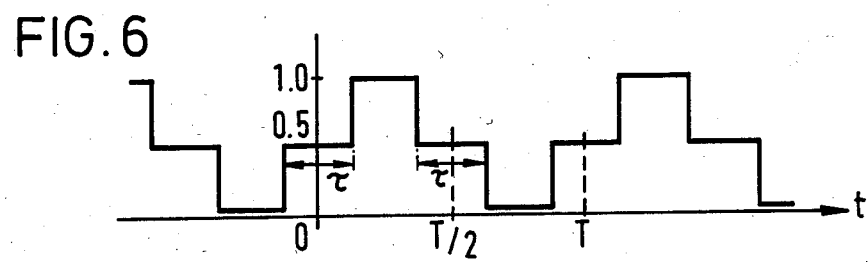
FIG. 6 is a diagram schematically showing a switching function.

FIG. 6 schematically shows a switching function of the double balanced type switching circuit apparatus constructed according to this invention. During periods in which both transistors 16 and 18 remain nonconductive (de-energized), the two pairs of transistors 28, 30 and 32, 34 of double balanced construction are balanced, and current flowing at that time is divided into two equal quantities.

More specifically, since one differential pair of transistors 28 and 30 is balanced, current $I_1+i$ from current source 10 is divided into two $0.5(I_1+i)$ quantities which flow through load resistors 36 and 38, respectively. The switching function shown in FIG. 6 is only for one half of the double balanced circuit.

Assuming that the balancing period is expressed by $\tau$ and the period of switching signal by T, the switching function f(t) is given by the following equation:

$$f(t) = \frac{1}{2} + \frac{2}{\pi}\left(\cos\frac{\pi\tau}{T}\right)\sin\omega t + \left(\frac{1}{3}\cos\frac{3\pi\tau}{T}\right)\sin 3\omega t + \left(\left(\frac{1}{5}\cos\frac{5\pi\tau}{T}\right)\sin 5\omega t + \ldots\right)$$

The equation represents only up to the fifth harmonic for the sake of brevity. The fundamental harmonic component $\sin \omega t$, the third harmonic component $\sin 3\omega t$, and the fifth harmonic component $\sin 5\omega t$ have respective levels:

$$\cos\frac{\pi\tau}{T}, \frac{1}{3}\cos\frac{3\pi\tau}{T}, \text{ and } \frac{1}{5}\cos\frac{5\pi\tau}{T}.$$

Figure 7:
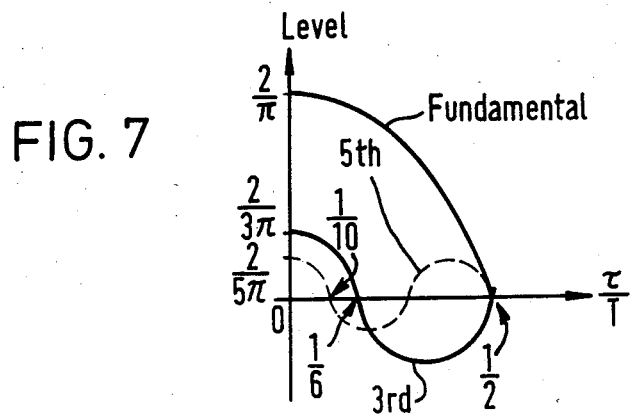
FIG. 7 is a diagram illustrating the relationship between levels of harmonic components and a ratio of the balancing period.

FIG. 7 shows the relationship between these levels and a ratio of the balancing period $\tau/T$.

The $\tau/T$ co-ordinates at which each cosine curve intersects the $\tau/T$ co-ordinate axis in FIG. 7 represents respective ratios of the balancing period $\tau/T$ where corresponding harmonic components are zero. For example, where the ratio of the balancing period $\tau/T$ is 1/10, the fifth harmonic component is zero. Where the ratio of the balancing period $\tau/T$ is 1/6, the third harmonic component is zero. In each case, the level of the fundamental harmonic component is not decreased severely from $2/\pi$.

In the prior art, multiplex decoders for receiving FM stereo broadcasts have used a low-pass filter for removing a birdie noise which is an interfering harmonic component about three times (38 kHz×3=114 KHz) the subcarrier frequency in an adjacent broadcast channel. In double balanced type switching circuit apparatus of the invention, however, birdie noise can be reduced to a considerable extent by setting the ratio of the balancing period $\tau/T$ into 1/6.

The present invention should not be limited to the embodiment as described hereinabove and illustrated in the drawings, but various modifications and adaptations may be made without departing from the scope of the invention. For example, the switching circuit apparatus can be constructed with only one differential amplifier circuit. Further, the switching circuit apparatus can be constructed with two switching circuits individually supplied with switched signal. While in the foregoing embodiment the transistors are shown as of the NPN type, PNP-type transistors may be employed with the polarities of the current sources and power supply being reversed.

According to the present invention, as described above, it is possible to provide a switching circuit apparatus of a simple construction which can operate at as low a voltage as possible. Thus it is intended that the present invention cover the modifications and variations of this invention provided they come within the scope of the appended claims and their equivalents.

What is claimed is:

1. A switching apparatus comprising:
   (a) first and second power source terminals;
   (b) first and second switching signal generators;
   (c) first and second loads;
   (d) switching means for selectively coupling said first and second generators and said first and second loads between said power source terminals in response to first and second control signals, said switching means including a first pair of transistors having current paths connected to selectively couple said first and second loads in series with said first and second signal generators, respectively, in response to said first control signal, and said switching means including a second pair of transistors having current paths connected to selectively couple said first and second loads in series with said second and first signal generators, respectively, in response to said second control signal; and
   (e) means for generating said first and second control signals, with said first and second control signals rendering at least said current paths of one of said first and second pairs of transistors fully conductive prior to termination of conductivity of the current paths of either said first or second pair of transistors.

2. A switching apparatus of claim 1 wherein said switching means comprises a double balanced differential amplifier circuit.

3. A switching apparatus of claim 1 wherein said first and second control signals each have a duty cycle which renders said first and second pairs of transistors conductive longer than non-conductive.

4. A switching apparatus of claim 3 wherein said first and second control signals are identical in shape and shifted 180° from each other in time.

* * * * *